(12) United States Patent
Okumoto et al.

(10) Patent No.: US 6,486,518 B1
(45) Date of Patent: Nov. 26, 2002

(54) STRUCTURES AND METHOD WITH BITLINE SELF-ALIGNED TO VERTICAL CONNECTION

(75) Inventors: Yasuhiro Okumoto, Ibaraki (JP); Michio Nishimura, Yamanashi-ken (JP); Toshiyuki Nagata, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/407,420

(22) Filed: Sep. 29, 1999

(51) Int. Cl.[7] .................. H01L 27/108; H01L 29/00; H01L 21/8242; H01L 21/20
(52) U.S. Cl. .................. 257/379; 257/382; 257/532; 257/296; 257/306; 438/239; 438/253; 438/396
(58) Field of Search .................. 438/210, 239, 438/241, 253, 256, 622, 637, 672, 675, 399; 257/379, 381, 382, 383, 384, 385, 532, 296, 306

(56) References Cited

U.S. PATENT DOCUMENTS

| | | | | |
|---|---|---|---|---|
| 5,519,237 A | * | 5/1996 | Itoh et al. | 257/306 |
| 5,837,577 A | * | 11/1998 | Cherng | 438/253 |
| 6,037,216 A | * | 3/2000 | Liu et al. | 438/253 |
| 6,137,179 A | * | 10/2000 | Huang | 257/763 |

\* cited by examiner

Primary Examiner—Carl Whitehead, Jr.
Assistant Examiner—Toniae M. Thomas
(74) Attorney, Agent, or Firm—Carlton H. Hoel; W. James Brady; Frederick J. Telecky, Jr.

(57) ABSTRACT

A way to combine the metal bitline with the vertical interconnection to the capacitor over the bitline. In this class of embodiments, the vertical interconnect pillar is formed before fabrication of the bitline is completed. To accomplish this, the bitline metal is patterned using a step which allows it to extend vertically along the walls of the vertical interconnect pillar, but does not create any electrical connection between the bitline metal and the vertical interconnect pillar.

2 Claims, 5 Drawing Sheets

STRUCTURES AND METHOD WITH BITLINE SELF-ALIGNED TO VERTICAL CONNECTION

BACKGROUND AND SUMMARY OF THE INVENTION

The present invention relates to interconnect sutures and fabrication methods for integrated circuit memory.

Background: DRAM Cells

A dynamic random access memory (DRAM) is a MOS memory device which stores a bit of information as a charge on a capacitor. Since this charge decays away in a finite length of time (usually in milliseconds), the DRAM cell periodically needs to be refreshed to restore the charge so that the DRAM retains its "memory". There are many advantages of DRAMs, one of which is that the basic memory cell is small and, thus, a very dense array can be made using these cells. Therefore, DRAMs have a lower cost per bit than memories with less compact arrays. DRAMs are also fast for a system to access, giving them a high performance rating.

The basic memory cell of a DRAM consists of a single transistor and a capacitor. In a typical DRAM structure, the bottom storage electrode (composed e.g. of a noble metal such as plum, or a conductive oxide such as ruthenium oxide) is overlaid by a dielectric layer that has a high dielectric constant. A top electrode, which can be of the same material as the bottom storage electrode, can then be deposited over the resulting stacked cell capacitor structures. A polysilicon plug beneath the bottom electrode provides contact with an underlying transistor.

Background: COB Cells

One type of DRAM cell is the capacitor-over-bitline (or "COB") cell, in which the storage capacitors are above the bitlines. This has the advantage that the whole area of the cell can be used for storage capacitors. It also has the advantage that exotic materials used for the capacitor plates and dielectric are far removed from the substrate, and used only at a very late stage of processing.

However, COB cells are not easy to fabricate. In particular, the vertical connections to the storage capacitor must extend up through the layer of bitlines without making contact to any of them. The resistance of the bitlines and the vertical connections should both be as low as possible (to avoid degrading speed), so it is desirable not to waste any space at the bitline level.

Bitline Self-Alignment to Vertical Connection

The present application discloses a new way to combine the metal bitline with the vertical interconnection to the capacitor over the bitline. In one class of embodiments, the vertical interconnect pillar is formed before fabrication of the bitline is completed. To accomplish this, the bitline metal is patterned using a step which allows it to extend vertically along the walls of the vertical interconnect pillar, but does not create any electrical connection between the bitline metal and the vertical interconnect pillar.

In another class of embodiments, a sacrificial layer is used to define the lateral layers of bitline Advantages of the disclosed methods and structures, in various embodiments, can include one or more of the following: simplicity of fabrication, without the contact filling steps normally required for COB structures.

BRIEF DESCRIPTION OF THE DRAWINGS

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

Figure 1:
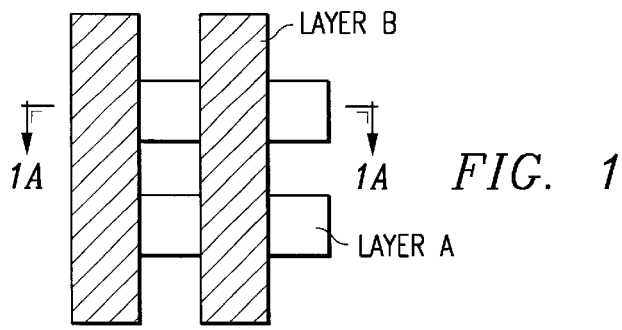
FIG. 1 shows a pattern of bitlines and pillars according to one class of embodiments of the present teachings.

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Definitions

Following are some of the technical terms which are used in the present application. Additional definitions can be found in the standard technical dictionaries.

Amorphous: A material in which there are no crystalline portions.

Bandgap: The range of energies which is normally unavailable to carriers in an undoped semiconductor. For example, the bandgap of germanium is about two-thirds of a Volt, that of silicon is slightly more than a Volt, and that of gallium arsenide is slightly less than 1½ Volts.

Bipolar Tran: A type of transistor in which current flow between emitter and collector diffusions is controlled by current at a base diffusion.

Body: The material within which a transistor channel is formed.

Body Effect: A shift in the threshold voltage of a transistor due to capacitive coupling between the gate voltage and the body.

Carrier: In a semiconductor, an electron or hole, which can move around in the semiconductor material to transport charge. The movement of carriers is how electrical current flows.

CMOS: A circuit containing at least one NMOS and at least one PMOS transistor, or a chip containing at least one such circuit.

Contact: An approximately vertical connection from metallization to a semiconductor layer (whether a gate line or a source/drain diffusion), possibly including a barrier layer to separate the metal from the semiconductor.

Contact Resistance: The resistance of a contact, or more generally the inverse of the conductance per unit area of a given contact interface. Units are ohms times area.

Current Leakage: Current leakage, or leakage current, is current that escapes from the device by means other than that intended, such as through parasitic bipolar action.

Depletion: Reduction of carrier density, in a volume of semiconductor material, due to applied voltage.

Diffusion: The process of diffusion is the spontaneous movement of dopant or impurity atoms through a semiconductor, at a rate which depends on temperature and on the particular elements involved. The noun "diffusion" usually refers to a doped portion of a semiconductor material.

Diffusion Barrier: A material in which impurities have a low diffusion constant. For example, titanium nitride is often used as a conductive diffusion barrier material in silicon integrated circuit technology.

Diode: A two-terminal device. Typically a diode is rectifying, i.e. passes current in only one direction. A rectifying diode may be implemented, for example, by a P-N junction in a semiconductor material.

Dopant: An atom added to a semiconductor, which, when activated, provides a "carrier" (i.e. an electron or hole) which can move around in the semiconductor to enable the flow of current. For example, in silicon technology, boron or gallium can act as P-type dopants (or "acceptors"), and phosphorus, arsenic, or antimony can act as N-type dopants (or "donors").

Drain: In a field-effect transistor, the diffusion to which majority carriers are emitted. For example, in an NMOS transistor, the drain will often be found connected to he more negative supply voltage (e.g. ground). In a PMOS transistor, the source will often be found connected to a positive power supply voltage.

DRAM: A dynamic random-access memory, i.e. a memory in which the stored data must be regularly read out from and written back into the cell.

Electromigation is the physical transport of material within a conductor which occurs at high current densities. In integrated circuit metallization this transport can cause a conductor to neck down and fail in service.

Field-Effect Transistor (FET): A three-terminal device in which current between two current-carrying electrodes ("Source" and "drain") is controlled by the voltage applied to a "gate" terminal.

Gate: In a field-effect transistor, the electrode to which a control voltage is applied to modulate the conduction of the transistor.

Grain Boundary: An interface between separate grains in a polycrystalline material. The grain boundaries often have conduction and diffusion properties which are very different from those in the grains' interiors.

Junction: An interface between p-type and n-type semiconductor material.

MOSFET: An insulated-gate field effect transistor, in which the gate is separated from the channel by a thin layer of an insulating material.

N-channel: A channel of n-type semiconductor material induced in a FET as a result of a bias applied to the gate. This channel allows current to flow from the drain to the source of an NMOS transistor. Typically an N-type channel is formed by surface inversion of p-type material, but it may also be formed by surface enhancement of n-type material.

NMOS: An n-channel field effect transistor, or a circuit or chip containing this type of transistor.

N-type: A volume of semiconductor which normally includes an excess of electrons. This can be achieved by introduction of "donor" dopants (such as phosphorus, arsenic, or antimony in silicon).

P-channel: A channel of p-type semiconductor material induced in a FET as a result of a bias applied to the gate. This channel allows carriers to flow from the source to the drain of a PMOS transistor.

P-type: A volume of semiconductor which normally includes an excess of holes. This can be achieved by introduction of "acceptor" dopants (such as boron or gallium in silicon).

Perovskite: A compound (of formula $WXZO_3$) analogous to barium strontium titanate, strontium bismuth tantalate, or lead zirconium titanate. Many perovskites have high dielectric constants, or are ferroelectrics.

Platinum-family metals: Iridium, rhodium, osmium, iridium, ruthenium, palladium, and platinum. For some purposes rhenium, tantalum, or niobium can also be considered as alternatives to platinum.

PMD (pre-metal dielectric)—a dielectric layer between the polysilicon gate/interconnect level and the lowest metal layer (which is conventionally referred to as "Metal 1"). (Sometimes the term "multilevel oxide", or "MLO," is used instead of PMD.) The dielectric layers between metal levels are called intermetal dielectrics. (Sometimes the term "interlevel dielectric," or "ILD", is used instead.) The intermetal dielectric between Metal 1 and Metal 2 is designated as DM1, etc. Contact holes are openings in the PMD. Openings in the intermetal dielectric are called vias—these allow contact to be made between Metal 1 and Metal 2, Metal 2 and Metal 3, etc.

PMOS: A p-channel field effect transistor, or a circuit or chip containing this type of transistor.

POLY: Originally engineering slang for polysilicon, this term (or the related terms POLY1, POLY2, POLY3, POLY4) also refers to a patterned conductor level which provides transistor gates, resistors, or sometimes TFT transistor channels.

Polycide: A composite of polycrystalline silicon and a metal silicide.

Polycrystalline: A material which is neither monocrystalline nor amorphous, but instead includes monocrystalline grains separated by grain boundaries.

Polysilicon: Polycrystalline silicon.

Resistivity: A measure of the resistance of a given material. Units are ohms times length.

Schottky Diode: A diode formed by a metal-semiconductor interface.

Semiconductor: A material which is less conductive than a metallic material, but more conductive than an insulator. (More precisely, a semiconductor will have a nonzero "bandgap" between its valence and conduction bands, which is no more than a few electron volts at the very most.) The most frequently used semiconductor material is silicon, but there are many others, including gallium arsenide (or "GaAs"), silicon-germanium, mercury cadmium telluride, indium phosphide, gallium-indium arsenide-phosphide, and silicon carbide.

Sheet Resistance: The resistance of a square resistor, made from a given thin-film material, which has contacts on two opposite sides.

SOI: Silicon on insulator device. These devices have a steeper subthreshold slope than conventional bulk devices, thus reducing off-state current without increasing Vt.

Source: In a field-effect transistor, the diffusion from which majority carriers are emitted. For example, in an NMOS transistor, the source will often be found connected to the more negative supply voltage (e.g. ground). In a PMOS transistor, the source will often be found connected to a positive power supply voltage.

Texture: Texture is the crystallographic alignment of the grain structure in a polycrystalline solid. Although grain alignments will differ slightly through a film, the predominate grain alignment defines the texture of the film.

TFT: A thin film transistor, in which the channel is made of a polycrystalline (rather than monocrystalline) material.

Via: An approximately vertical connection from one metallization layer to another.

FIRST CLASS OF EMBODIMENTS

FIG. 1 shows a top view of relevant patterns in a first class of embodiments. This example shows an intermediate stage in the fabrication of a DRAM cell (or in analogous integrated circuit processes). Layer A, in this example, is the pattern of the pillars which makes the vertical connection from the substrate (where the pass transistor is) and the Storage Node. (The Storage Node is the capacitor's lower plate, not shown in this figure, on which charge will be stored.) This capacitor will be added by conventional later steps, after the innovative steps described have constructed the bitlines and vertical connection pillar. In this drawing, four such pillars are shown.

Layer B, in this example, is the Bitline. (This is a metal line which connects the cell's output signal to sense amplifiers.)

To create the structure shown in FIG. 1, first a transistors are formed on a substrate. Next, a dielectric is deposited over the transistors and vertical plugs are formed to make contact between one terminal of the transistors and the pillars 102.

Figure 1A:
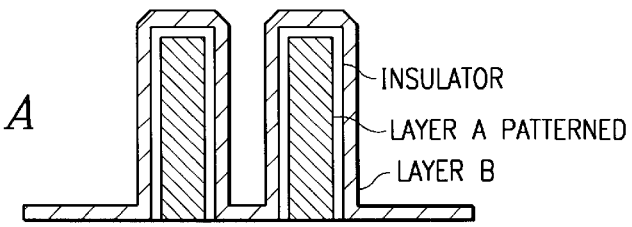
FIGS. 1A–D show key steps in the fabrication process for achieving a self-aligned interconnect as shown in FIG. 1.

Next a layer of polysilicon is deposited. A photoresist mask is then deposited and an etchback performed to from the pillars 102. The photoresist is then removed and an insulator layer, silicon nitride in this example, is then deposited over the pillars 102. A photoresist mask is then deposited and another etchback performed so that the insulator material remains only over the pillars 102. The photoresist is then removed and layer B, polysilicon in this example, is then deposited over the top. Resulting in the structure shown in FIG. 1A which shows a section, along the line 1A—1A, through the structure shown in FIG. 1.

Figure 1B:
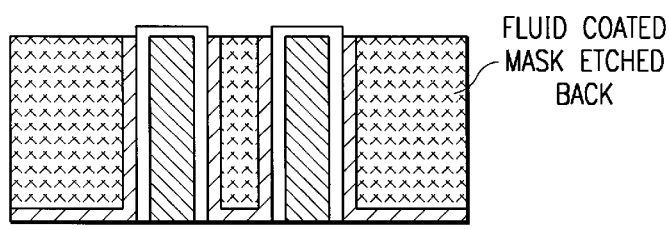

Next, a fluid coated mask, such as SOG, is deposited and etched back resulting in the structure shown in FIG. 1B.

Figure 1C:
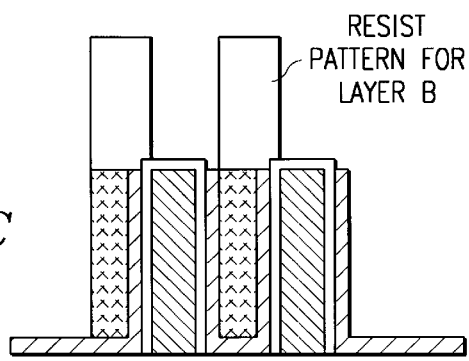

Next a photoresist pattern for layer B is deposited resulting in the structure shown in FIG. 1C.

Figure 1D:
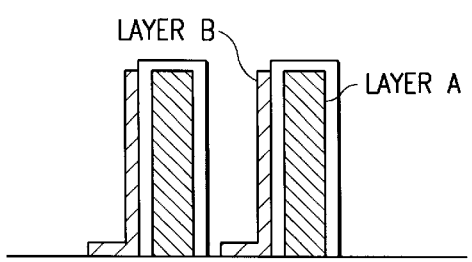

Finally, the structure is etched and the photoresist mask is removed which results in the structure shown in FIG. 1D.

SECOND CLASS OF EMBODIMENTS

FIGS. 2 and 2A–2G show a second embodiment of the invention. In the top view of FIG. 2, a frame pattern is shown. This pattern is the compliment of the bit line pattern. The open spaces labeled $BL_{n-1}$, $BL_n$, and $BL_{n+1}$ are the places where three different bit lines would go. This structure has been condensed for compactness: in a real structure, the portion contained within dotted lines would be replicated many times, to make up a memory cell array with the desired number of rows and columns. Four pillars 201 are shown. For a capacitor-over-bitline (COB) cell, these pillars 201 must pass up through the plane of the bitline, in order to reach the overlying capacitor structures. Also shown is the location of a bitline contact (BLCT), which is a location where the bitline will make contact to the underlying semiconductor body (i.e. silicon N+Drain diffusion, in this example).

Figure 2:
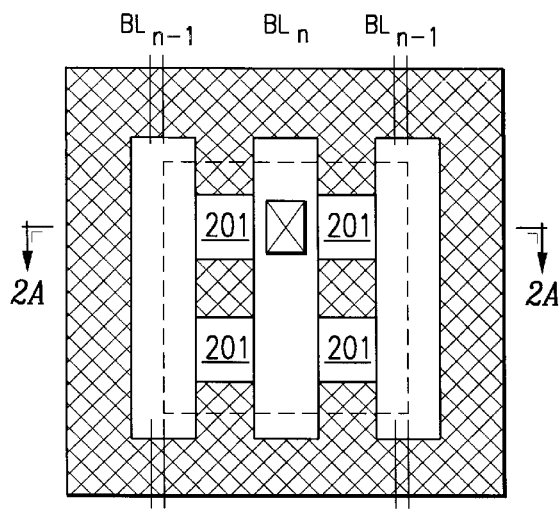
FIG. 2 shows a frame pattern view of a second embodiment of the present teachings.
Figure 2A:
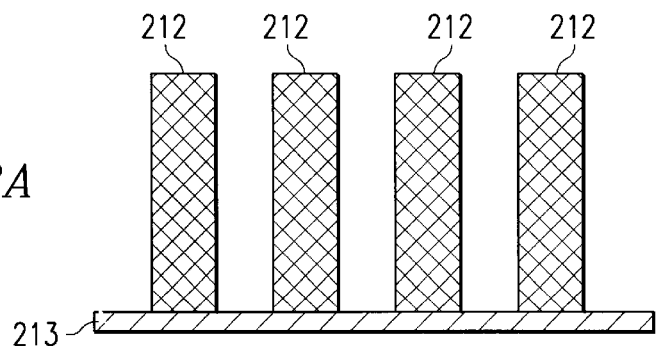
FIGS. 2A–G show key steps in the fabrication process for achieving a self-aligned interconnect as shown in FIG. 2

FIG. 2A shows a section, along the line 2A—2A, through the structure shown in FIG. 2. Four lines 212 of the frame structure are visible in section. The frame structure can be made, for example, of polysilicon. (In other contemplated alternative embodiments, other material can be used as discussed below.)

Note that these structures have a high height-to-width ratio (aspect ratio) e.g. approximately 4:1 in the example shown. These lines are the frame structure run on top of an underlying dielectric 213, which in this example is silicon oxide.

Figure 2B:
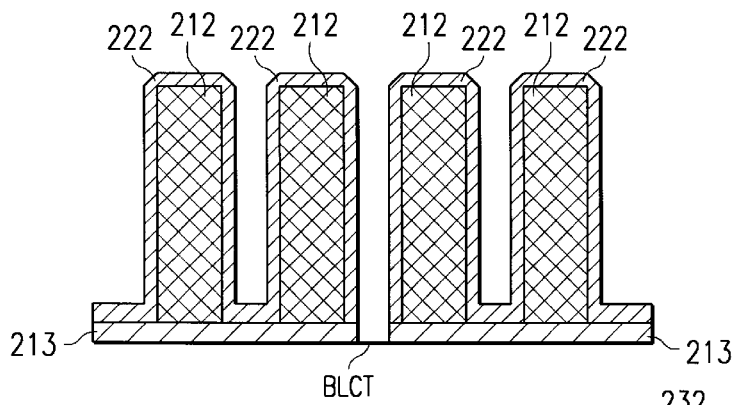
Figure 2C:
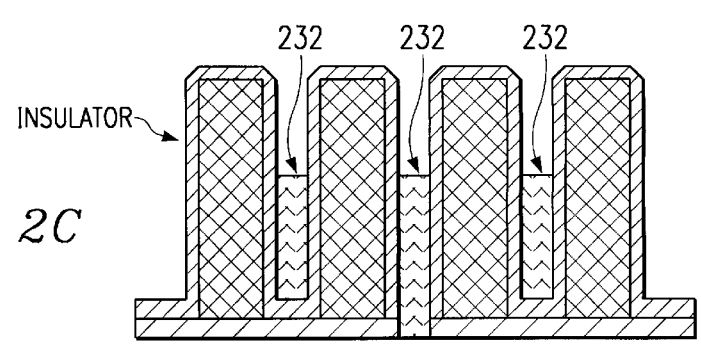

In FIG. 2B, a conformal dielectric 222 which is silicon dioxide in this example, has been conformally deposited overall. Also, a patterned edge has been used to remove the silicon oxide layer 213 at the DLCT bitline contact location.

Subsequently the interior spaces between the frame lines are filled by a conductive material 232, such as polysilicon, which has good gap filling properties. Preferably an etch back step is used to etch back this conductive material to less than the height of the frame elements. In the example shown, the bitline material 232 has been etched back in FIG. 2C, to approximately 60% of the height of the lines of the frame material.

Figure 2D:
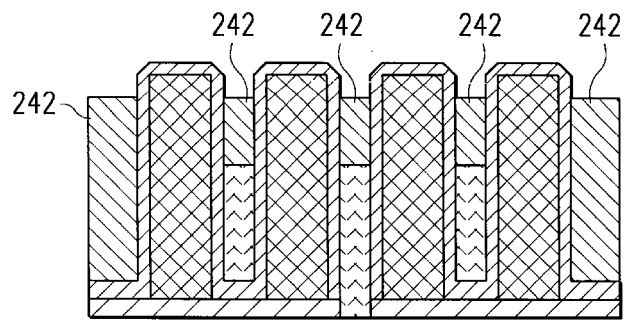
Figure 2E:
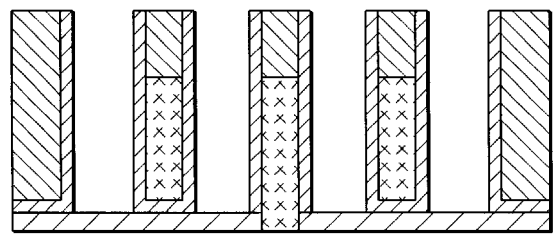

FIG. 2D shows a further stage, after an insulator 242 has been deposited overall and etched back (selectively with respect to the side wall coating material, silicon nitride in this example.) This leaves a structure in which the bitline material is enclosed by insulators on top and all sides.

There after the side wall insulator material 222, silicon nitride in this example, is removed from on top of the spacer frame, e.g. by a CMP process followed by a selective etch. This provides the structure of FIG. 2E, in which the bitlines 232 are each insulated on the top and laterally insulated on their sides.

Note that the frame material is originally continuous through the array.

Next the top portion of the side wall insulator is removed, e.g. by a CMP step, and the sacrificial material of the frame is entirely removed. This produces the structure shown in FIG. 2E in which 3 bitline portions are shown. Note that at the edge of the array, at the extreme left and right portions of FIG. 2E, insulator portions 242 have the same height as the capped bitlines, so that overall topography is minimized.

Figure 2F:
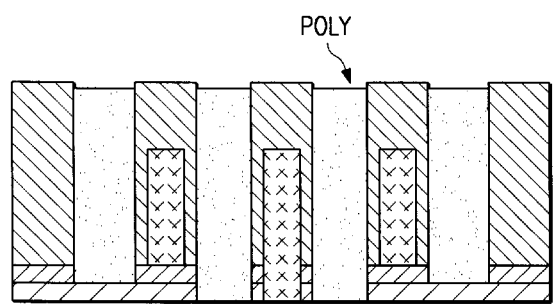
Figure 2G:
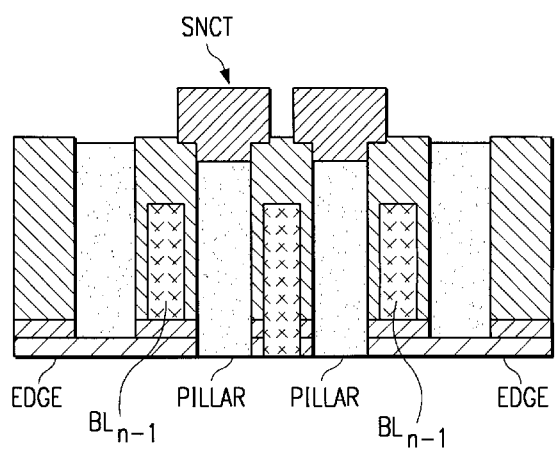

FIG. 2F shows the structure after polysilicon has been globally deposited and etched back to fill the openings in the bitline pattern. However, before the polysilicon is done, a patterned etch is used to open the bottom insulator where the storage node contacts SNCT are located. Thus, the central part of FIG. 2 shows two vertical connections. Thereafter, as shown in FIG. 2G, metal landing pads are preferably added to form the bottom contact. A dielectric can now be deposited over all, and planarized e.g. by CMP, to provide a planar starting point for fabrication of the capacitor itself.

Figure 3:
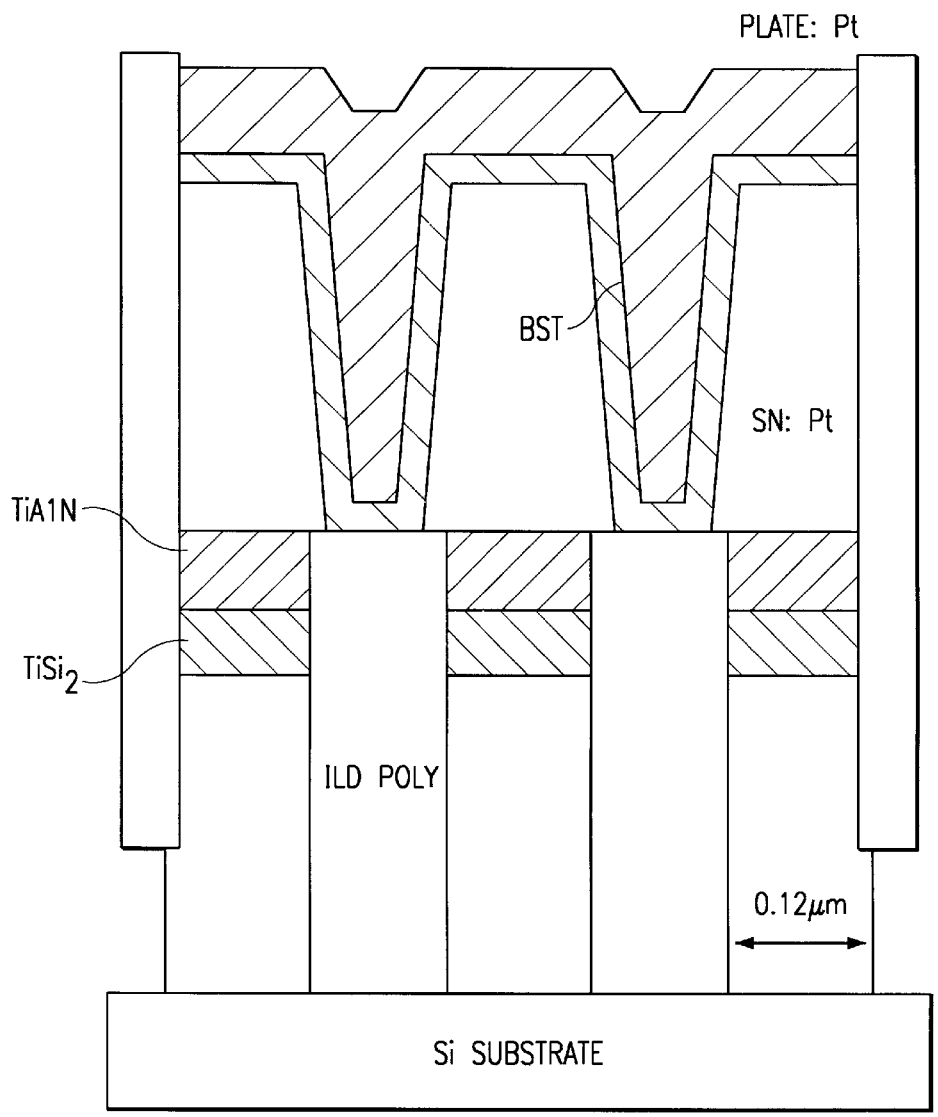
FIG. 3 shows a COB cell.

FIG. 3 depicts an example of a COB cell.

Figure 4:
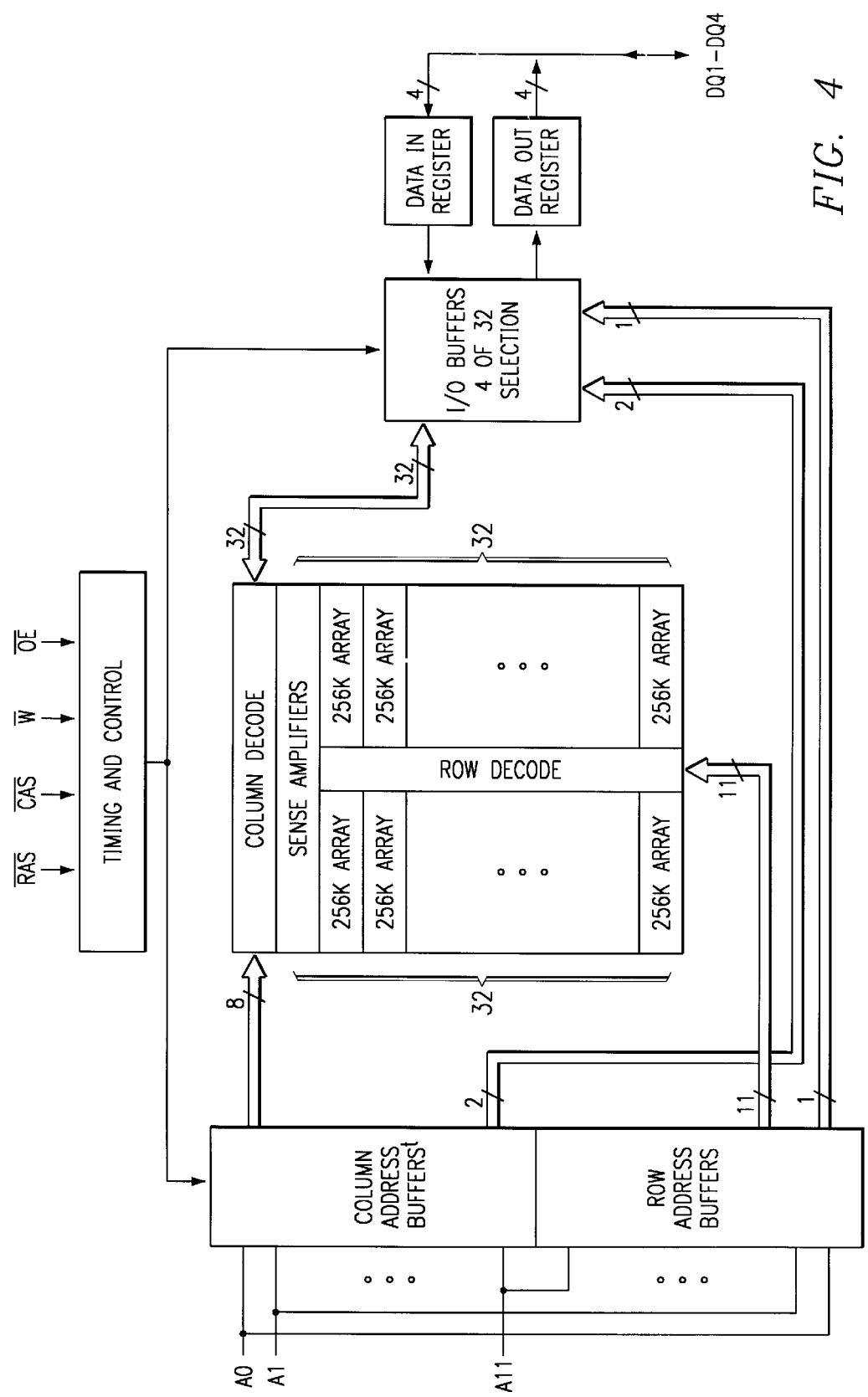
FIG. 4 shows a CRAM chip.

FIG. 4 depicts an example of a DRAM array which could be made up of DRAM cells constructed according to the present teachings.

According to a disclosed class of innovative embodiments, there is provided: An integrated circuit memory structure, comprising: plurality of transistors; a plurality of vertical connection structures, which electrically connect first current-carrying portions of said transistors to respective capacitors; a plurality of conductive bitlines, which are electrically connected to second current carrying portions of said transistors, but not to said capacitors; wherein said bitlines are thin-film metal structures which are extended upward along ones of said vertical connection structures, but are substantially planar in other locations.

According to another disclosed class of innovative embodiments, there is provided: An integrated circuit memory structure, comprising: a plurality of insulated bitlines; and a plurality of vertical connections interspersed with said bitlines; wherein some ones of said vertical interconnects are connected at the bottom to a transistor area, and at the top to a capacitor; and wherein others of said vertical connections are not connected to a transistor, but are left floating.

According to another disclosed class of innovative embodiments, there is provided: A method for fabricating a capacitor-over-bitline DRAM cell, comprising the steps of: forming vertical connection structures; and then forming bitlines which do not make electrical connection to said vertical connection structures, and do not extend above a top surface thereof, and extend vertically along some sidewalls of said vertical connection structures; and then forming capacitors which lie above said bitlines, and are contacted by said vertical connection structures, and are not contacted by said bitlines.

MODIFICATION AND VARIATIONS

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

For example, the bottom of the bitline metallization does not have to be precisely coplanar with the bottom of the vertical connections. In alternative embodiments, other layers can be added below the bitlines (with appropriate adjustments to the contact structure).

In contemplated alternative embodiments, this percentage of etchback of the bitline material relative to the height of the lines of the frame material can be higher 60%.

In a contemplated class of alternative embodiments, other materials with good conformal deposition properties can be used instead of polysilicon. For example, by further deposition of CVD tungsten and global etch back, a tungsten/polysilicon stack can be created. For another example, if a barrier layer is used at the bottom of the contact, other materials conventionally used for metalization can be used instead. This conductive material will provide the bitline conductors, so choice of its composition is important. It should also be noted that the number of layers of metallization described above does not implicitly limit any of the claims, which can be applied to processes and structures with more or fewer layers.

Similarly, it will be readily recognized that the described process steps can also be embedded into hybrid process flows, such as BiCMOS or smart-power processes.

The teachings above are not necessarily strictly limited to silicon. In alternative embodiments, it is contemplated that these teachings can also be applied to structures and methods using other semiconductors, such as silicon/germanium and related alloys, gallium arsenide and related compounds and alloys, indium phosphide and related compounds, and other semiconductors, including layered heterogeneous structures.

It should also be noted that, over time, an increasing number of functions tend to be combined into a single chip. The disclosed inventions can still be advantageous even with different allocations of functions among chips, as long as the functional principles of operation described above are still observed.

Additional general background, which help to show the knowledge of those skilled in the art regarding variations and implementations of the disclosed inventions, may be found in the following documents, all of which are hereby incorporated by reference: Coburn, Plasma Etching and Reactive Ion Etching (1982); Handbook of Plasma Processing Technology (ed. Rossnagel); Plasma Etching (ed. Manos and Flamm 1989); Plasma Processing (ed. Dieleman et al. 1982); Schmitz, CVD of tungsten and tungsten silicides for VLSI/ULSI applications (1992); Metallization and Metal-Semiconductor Interfaces (ed. Batra 1989); VLSI Metallization: Physics and Technologies (ed. Shenai 1991); Murarka, Metallization Theory and Practice for VLSI and ULSI (1993); Handbook of Multilevel Metallization for Integrated Circuits (ed. Wilson et al. 1993); Rao, Multilevel Interconnect Technology (1993); Chemical Vapor Deposition (ed. M. L. Hitchman 1993); and the semiannual conference proceedings of the Electrochemical Society on plasma processing.

What is claimed is:

1. An integrated circuit memory structure, comprising:

a plurality of transistors;

a plurality of vertical connection structures, which electrically connect first current-carrying portions of said transistors to respective capacitors;

a plurality of conductive bitlines, which are electrically connected to second current-carrying portions of said transistors, but not to said capacitors;

wherein said bitlines are thin-film metal structures which are extended upward along ones of said vertical connection structures, but are substantially planar in other locations.

2. An integrated circuit memory structure, comprising:

a plurality of insulated bitlines and a plurality of vertical connections interspersed with said bitlines;

wherein some ones of said vertical connections are connected at the bottom to a transistor area, and at the top to a capacitor; and wherein others of said vertical connections are not connected to a transistor, but are left floating.

* * * * *

UNITED STATES PATENT AND TRADEMARK OFFICE
CERTIFICATE OF CORRECTION

PATENT NO. : 6,486,518 B1  Page 1 of 1
DATED : November 26, 2002
INVENTOR(S) : Yasuhiro Okumoto, Michio Nishimura and Toshiyuki Nagata It is certified that error appears in the above-identified patent and that said Letters Patent is hereby corrected as shown below:

<u>Title page,</u>
Item [60], Related U.S. Application Data, insert:
-- [60] Provisional Application No. 60/102,385 filed 9/29/1998. --

Signed and Sealed this

Third Day of February, 2004

JON W. DUDAS
*Acting Director of the United States Patent and Trademark Office*